United States Patent [19]

Mizunashi

[11] Patent Number: 5,736,234

[45] Date of Patent: Apr. 7, 1998

[54] MULTILAYER PRINTED CIRCUIT BOARD HAVING LATTICED FILMS ON AN INTERCONNECTION LAYER

[75] Inventor: Harumi Mizunashi, Tokyo, Japan

[73] Assignee: NEC Corporation, Tokyo, Japan

[21] Appl. No.: 604,481

[22] Filed: Feb. 21, 1996

[30] Foreign Application Priority Data

Feb. 28, 1995 [JP] Japan .................... 7-040174

[51] Int. Cl.⁶ .................................... B32B 9/00
[52] U.S. Cl. .................... 428/209; 428/210; 428/901
[58] Field of Search .................... 428/209, 210, 428/901

[56] References Cited

U.S. PATENT DOCUMENTS

| | | | |
|---|---|---|---|
| 3,958,317 | 5/1976 | Peart | 428/901 |
| 4,189,524 | 2/1980 | Lazzari | 428/901 |
| 4,886,686 | 12/1989 | Muenstedt | 428/901 |
| 5,232,548 | 8/1993 | Ehrenberg | 428/901 |

OTHER PUBLICATIONS

"Surface Mount Technology", Jun. 1993, pp. 54–55.

*Primary Examiner*—Elizabeth Evans
*Attorney, Agent, or Firm*—Whitham, Curtis, Whitham & McGinn

[57] ABSTRACT

A multilayer printed circuit board has a substrate, an inner interconnection layer formed on each surface of the substrate, and an outer interconnection layer overlying each inner interconnection layer. The inner interconnection layer is formed of a copper sheet and two latticed metal films made of a metal having a low thermal expansion coefficient and bonded to boty surfaces of the copper sheet under application of pressure. The area ratio of exposed portions of the copper sheet to the whole surface of the interconnection layer is between 25 and 75%. Thermal expansion coefficient of the resultant circuit board is lowered to be close to the thermal expansion coefficient of a LSI, thereby obtaining reliability of a electronic product due to a low thermal stress. The metallic film is made of Kovar or Invar.

13 Claims, 3 Drawing Sheets

MULTILAYER PRINTED CIRCUIT BOARD HAVING LATTICED FILMS ON AN INTERCONNECTION LAYER

BACKGROUND OF THE INVENTION (a) Field of the Invention

The present invention relates to a multilayer printed circuit board having latticed films on an interconnection layer and, more particularly, to the structure of a multilayer printed circuit board having a low thermal expansion coefficient of the interconnection layer.

(b) Description of the Related Art

FIG. 1 schematically shows a cross section of a conventional glass fabric epoxy multilayer printed circuit board (referred to as "multilayer printed circuit board" or simply "circuit board", hereinafter). The multilayer printed circuit board comprises a plurality of conductor layers 12 and 15 each having interconnection patterns. Specifically, the multilayer printed circuit board of FIG. 1 has a four-layer interconnection structure including two outer interconnection layers 15 formed on the circuit board and two inner interconnection layers 12 formed within the circuit board.

The structure of the circuit board of FIG. 1 will be described by way of a fabrication process for the circuit board. An electrical insulator substrate (simply referred to as an insulating substrate, hereinafter) 10 is prepared by impregnating glass cloth with epoxy resin. During the step for preparing, a copper foil to be formed as an inner interconnection 12 is bonded to the entire area of each surface of the glass cloth under the application of pressure before the impregnated epoxy resin sets. Thereafter, the epoxy resin is allowed to set to increase the bonding strength.

The copper foil is then patterned by a photolithographic etching step, to form the inner interconnection layer 12. Copper foil having a thickness of 70 μm or 35 μm is commonly used for the inner interconnection layer 12. Therefore, copper foil for use as an outer interconnection layer 15 is formed on the inner interconnection layer 12 with the intervention of an epoxy-based adhesive sheet generally called prepreg 14.

In many cases, an oxide film is formed on the surface of the inner interconnection layer 12 immediately before the inner interconnection layer 12 is covered by the prepreg 4 to thereby increase bonding strength between the inner interconnection layer 2 and the prepreg 14.

Through-holes (not shown) are then formed at locations where the inner interconnection layer 12 is to be electrically connected to the outer interconnection layer 15, or locations where the outer interconnection layers 15 overlying both sides of the substrate 10 are to be connected together. The inside of each through-hole and exposed outer surfaces of the outer copper foils are chemically plated with copper. The outer copper foils are then subjected to a photolithographic etching step to form the outer interconnection layers 15. The outer interconnection layers 15 are coated with a solder resist, if required.

In the multilayer printed circuit board as described above, the thermal expansion coefficient of the circuit board is generally about $16.0 \times 10^{-6}$ C.$^{-1}$ in a direction parallel to the surface of the insulating substrate 10 within a practical temperature range, e.g., between $-20°$ and $125°$ C. The multilayer printed circuit board should have substantially the same thermal expansion coefficient as that of an electronic component, such as a transfer molded LSI, to be mounted on the multilayer printed circuit board. If this is satisfied, thermal stress arising at a junction, especially at a soldered junction region, between the circuit board and the electronic component will be small, which will ensure superior reliability of an electronic product due to a low thermal stress.

With the increase and diversion of functions of LSIs, chip size has significantly increased in recent years. On the other hand, the package size of an LSI receiving the chip has become smaller. Particularly, in a so-called TSOP (Thin Small Outline Package) LSI, such as a transfer molded LSI widely used for memories, the volume ratio of a chip to a package has increased. The overall thermal expansion coefficient of the LSI depends substantially on the thermal expansion coefficients of substances forming the LSI and the volume ratios between these substances. Accordingly, as the result of the increase in chip size and reduction in package size, the thermal expansion coefficient of the LSI approches that of the chip, and therefore, approaches that of silicon, which is the base material of the chip. The thermal expansion coefficient of silicon is about $4.0 \times 10^{-6}$ C.$^{-1}$, which is significantly lower than that of the package. In other words, the increase in chip size leads to reduction in the thermal expansion coefficient of the LSI.

As a result of the reduction in the thermal expansion coefficient of the LSI, a difference in thermal expansion coefficient increases between the LSI and the multilayer printed circuit board mounting the LSI, which in turn reduces the reliability of the junction between the LSI and the circuit board due to a thermal stress acting therebetween. To prevent an increase in the difference in thermal expansion coefficient, various attempts have been made to reduce the thermal expansion coefficient of the multilayer printed circuit board. Specifically, as described on pages 54 to 55 of "Surface Mount Technology", published in June, 1993, several measures have been adopted, such as using ceramic having a low thermal expansion coefficient as a base material for a circuit board and using special resin materials.

Of the above mentioned measures, use of a low thermal expansion coefficient ceramic is realized by two different methods. In one method, a known multilayer ceramic substrate is used which includes alumina ($Al_2O_3$) as a base material. In the other method, porous ceramic is impregnated with a resin to obtain an insulating board.

Substrates having a low thermal expansion coefficient by use of an organic material as a base material include one comprising glass cloth having a higher density than conventional glass cloth. Those substrates take advantage of the fact that silica ($SiO_2$) has a smaller thermal expansion coefficient than epoxy resin. The overall thermal expansion coefficient of the resultant substrate is reduced by increasing the density of silica. In addition to the above circuit boards, another multilayer printed circuit board has been developed which has unwoven cloth made of para-aramido resin instead of glass cloth.

Among the multilayer printed circuit boards having a low thermal expansion coefficient by employing the above mentioned measures, especially the low thermal expansion circuit board made of an organic material, are circuit boards designed to reduce the overall thermal expansion coefficient thereof by reducing the thermal expansion coefficient of the insulating substrate. The design of these boards takes into consideration the fact that the thermal expansion coefficient of a circuit board depends on the volume ratio of the insulating substrate to the interconnection layers as well as on the thermal expansion coefficients thereof. However, in this case, since copper foil is used for the interconnection pattern as in a conventional circuit board, there is a higher risk of the interconnection layer peeling off the insulating substrate, due to a difference in thermal expansion coefficients between the interconnection layer and the insulating substrate.

To prevent such peeling-off, the thickness of the copper foil may be reduced, for example. This degrades other characteristics, however. For example, the heat conductivity of the multilayer printed circuit board, particularly the heat conductivity in the direction parallel to the layers of the circuit board, which affects heat radiation from the circuit board, depends on the area ratio of the insulating substrate to the copper foil within a vertical cross section of the circuit board. Since the heat conductivity of the copper foil is 500 to 1000 times as large as that of the insulating substrate, the heat conductivity substantially depends on the thickness of the copper foil.

Therefore, despite the fact that the thickness of the copper foil should preferably be large in view of heat radiation, the thickness of the copper foil should be reduced in order to decrease the thermal expansion coefficient of the circuit board. In other words, desirable heat radiation and a desirable thermal expansion coefficient of a conductor layer in the circuit board are trade-offs with respect to the thickness of the conductor layer.

The use of special resin material mentioned in the publication, such as para-aramido resin in a substrate, increases the fabrication cost of the resultant circuit board.

The circuit board of a low thermal expansion type including an inorganic material is superior both in terms of thermal expansion coefficient and heat conductivity to the above-described circuit board having an organic substrate. However, this type of circuit board is more expensive than the conventional circuit board, i.e., it is generally ten times or more expensive than the conventional circuit board. On the other hand, an insulating substrate made by impregnating porous ceramic with resin raises the fabrication cost of the circuit board only slightly, by about 1.5 times as much as the conventional circuit board. However, this type of substrate has a problem in that the porous ceramic is prone to cracking.

The multilayer printed circuit board having an organic material is not susceptible to damage even when it is bent or twisted to a certain degree and, therefore, it can be screwed onto a frame. In contrast, the circuit board having a ceramic substrate must be fixed to a frame such that the ceramic circuit board is not directly subjected to fixing force, because the ceramic cracks upon receipt of bending or twisting force. For this reason, it is necessary to impose various restrictions upon handling of the ceramic circuit board.

In summary, the proposed multilayer printed circuit boards have their own disadvantages in terms of reliability and heat dissipation for electronic products.

SUMMARY OF THE INVENTION

In view of the foregoing, it is an object of the present invention to provide a multilayer printed circuit board having a lower thermal expansion coefficient and a high heat conductivity and capable of being manufactured at a relatively low cost.

The present invention is directed to a multilayer printed circuit board comprising a planar substrate having at least one main surface, at least one conductor layer overlying the main surface, the conductor layer having a metallic sheet made of a first metal having a first thermal expansion coefficient and a metallic film formed on each side of the metallic sheet, the second metallic film being made of a second metal having a second thermal expansion coefficient lower than the first thermal expansion coefficient.

In accordance with the multilayer printed circuit board according to the present invention, it is possible to reduce the thermal expansion coefficient of the circuit board because of the structure of the conductor layer while maintaining desirable heat radiation from the circuit board.

In the present invention, use of copper, for example, for the metallic sheet ensures superior heat radiation, while use of fernico (Kovar), for example, as the metallic films on the surface of the copper sheet reduces the thermal expansion coefficient of the surface portion of the copper sheet. As a result, the difference in thermal expansion coefficient between the copper sheet and the insulating substrate decreases, which in fact makes it possible to assure the reliability of a junction between the conductor layer and the insulating substrate due to a low thermal stress.

In a preferred embodiment of the present invention, use of fernico or Invar, both of which are frequently used, as the metallic films having a latticed form and press-bonded to the surface of the copper sheet only slightly raises the fabrication cost of the circuit board while obtaining desirable characteristics of the circuit board in reliability and heat dissipation for the electronic products.

The above and other objects, features and advantages of the present invention will be more apparent from the following description with reference to the accompanying drawings.

DESCRIPTION OF THE PREFERRED EMBODIMENTS

The present invention will be described in more detail by way of preferred embodiments with reference to the accompanying drawings, in which similar reference deisgnations represent similar materials or elements throughout the drawings.

Figure 1:
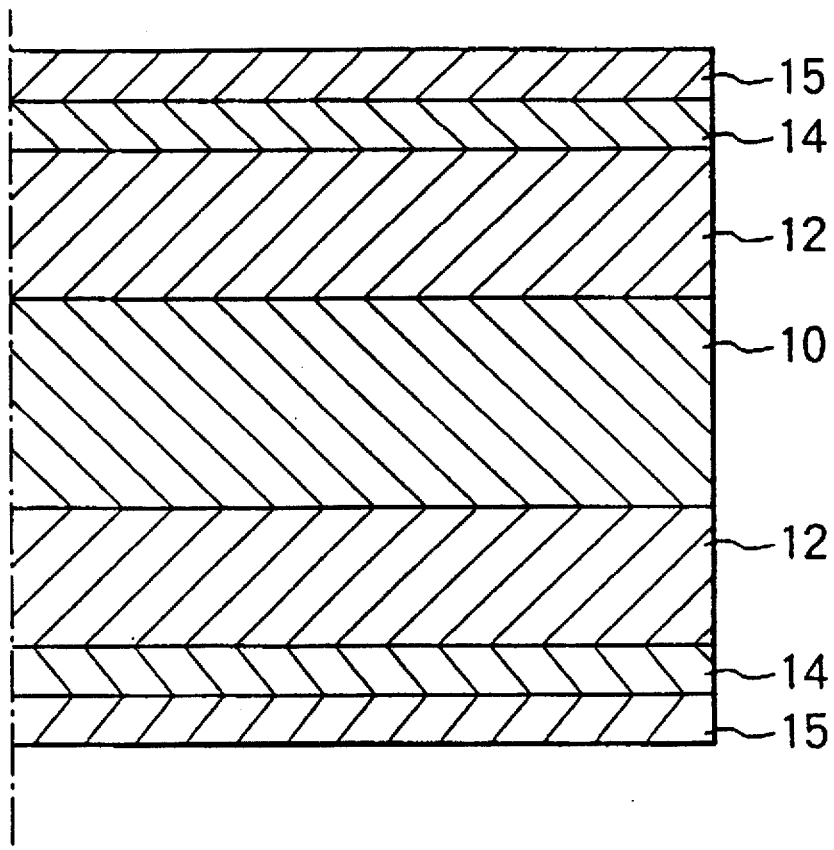
FIG. 1 is a vertical sectional view showing the structure of a conventional multilayer printed circuit board.
Figure 2A:
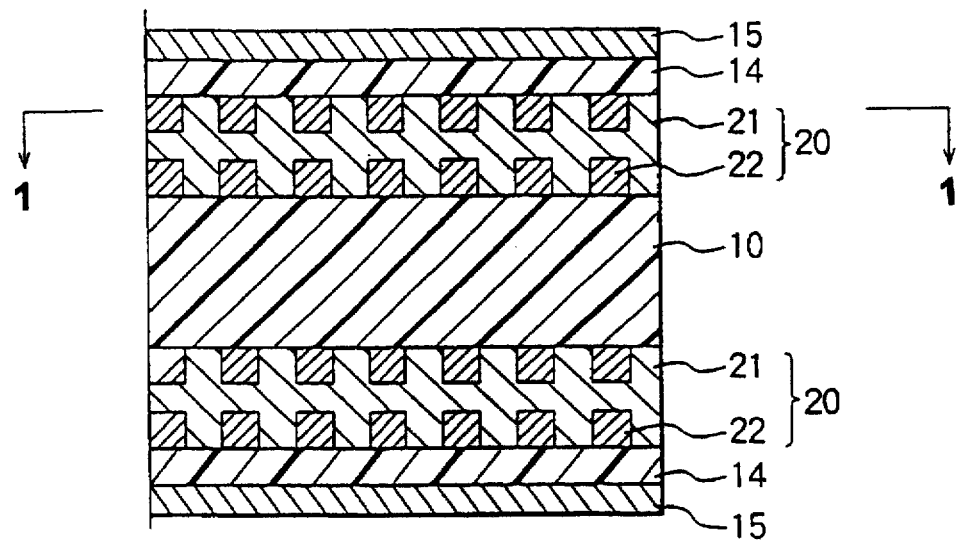
FIG. 2A is a vertical sectional view showing the structure of a multilayer printed circuit board according to a first embodiment of the present invention.

Referring to FIG. 2A, a multilayer printed circuit board according to a first embodiment of the present invention has a known insulating substrate 10 made by impregnating glass cloth with epoxy resin. The planar insulating substrate 10 has a volume ratio of glass cloth to epoxy resin of about 7:3.

Structure of the circuit board of FIG. 2A will be described by way of a process for fabricating the same. Conductor layers, each for implementing an inner interconnection layer 20 are laminated to the entire area of both the surfaces of the insulating substrate 10. The conductor layers are subjected to patterning to form inner interconnection layers 20 by a photolithographic etching technique. Subsequently, prepreg 14 is thermally bonded onto each of the patterned conductor layers 20 under the application of heat and pressure. A commercially available epoxy resin can be used for the prepreg 14. Thereafter, an outer interconnection layer 15 is further laid on each of the prepregs 14, thereby obtaining the structure shown in FIG. 2A. In FIG. 2A and other drawings, elements less relevant to the principle of the present invention, such as through-holes for connecting interconnection layers together and a solder resist for protecting outer interconnection layers formed on the surface of the circuit board, are omitted for purposes of simplification.

Each of the conductor layers implementing the inner interconnection layers 20 is made of a copper sheet 21 latticed metallic films 22 bonded to both sides of the copper sheet 21 under the application of pressure. The surfaces of the latticed metallic films 22 are flush with the surface of the copper sheet 21. Fernico, also known as Kovar, consisting substantially of 29 wt. % of nickel, 17 wt. % of cobalt and the balance of iron, is preferably used as the latticed metallic films 22.

Figure 2B:
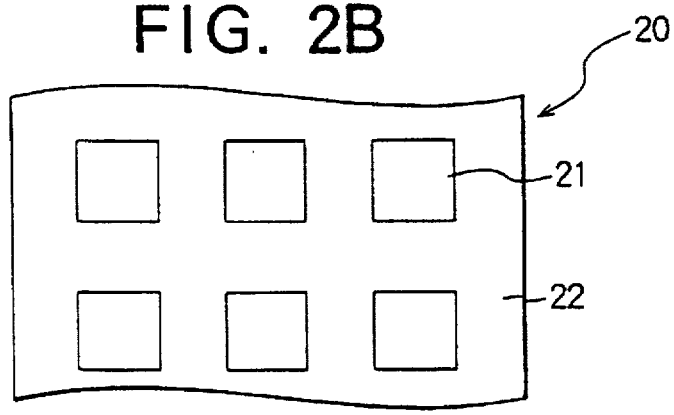
FIG. 2B is an enlarged, partial horizontal view taken along line A—A of FIG. 2A.

Referring to FIG. 2B, the surface of the copper sheet 21 is exposed in the interstices or meshes of the latticed fernico film 22. The total area of the exposed copper surface is about 50% of the overall surface of the conductor layer 20. A preferable area ratio of the exposed copper surface to the overall conductor surface is between 25 and 75%. The mesh size of the lattice is preferably between 1 mm and 2 mm before rolling shown in FIG. 2C.

Figure 2C:
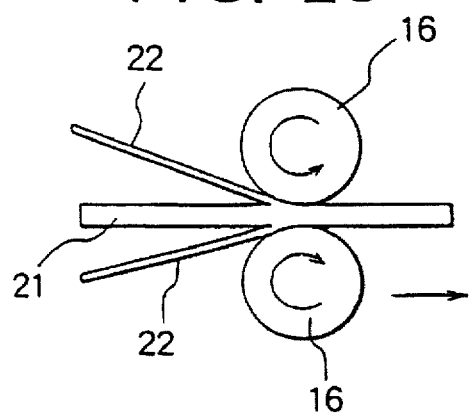
FIG. 2C is a schematic side view showing a step for forming a conductive layer shown in FIGS. 2A and 2C.

Referring to FIG. 2C, metallic films 22 are bonded to an oxygen-free-copper sheet 21 by the application of pressure to form the conductor layer for the inner interconnection layer 20. During the fabrication step of the conductor layer, an oxygen-free-copper sheet 21 is first sandwiched between latticed fernico films 22, followed by rolling by rollers 16 to bond the latticed fernico films 21 to the copper sheet 21 under the application of pressure, thereby obtaining the conductor layer made of oxygen-free-copper sheet 21 with the latticed metallic films 22.

The thermal expansion coefficient of copper is generally $17 \times 10^{-6°}$ C.$^{-1}$ while the thermal expansion coefficient of fernico is generally $5.3 \times 10^{-6°}$ C.$^{-1}$, which is significantly lower than that of copper. From the configuration as described above, the overall thermal expansion coefficient can be obtained at the surface of the inner interconnection layer 20, ranging between 10 and $13 \times 10^{-6°}$ C.$^{-1}$, which is approximately a mean value of the thermal expansion coefficients of copper and fernico. The inner interconnection layer 20 made from the conductor layer preferably has a wide planar pattern to serve for a power supply line or a ground line in the circuit board, and not to serve for signal lines.

The multilayer printed circuit board according to the first embodiment was manufactured and measured in its characteristics. A thermal expansion coefficient of 10 to $12 \times 10^{-6°}$ C.$^{-1}$ was obtained in the direction parallel to the conductor layer of the circuit board at temperatures ranging between $-20°$ and $125°$ C. With respect to reliability, it was confirmed that no peeling-off occurred at the junctions of the circuit board after up to 1000 heat cycles carried out for temperatures ranging between $-40°$ and $125°$ C. The fabrication cost of the circuit board of this embodiment only rose by about 3% compared to the cost of the conventional multilayer printed circuit board using copper foils.

Figure 3:
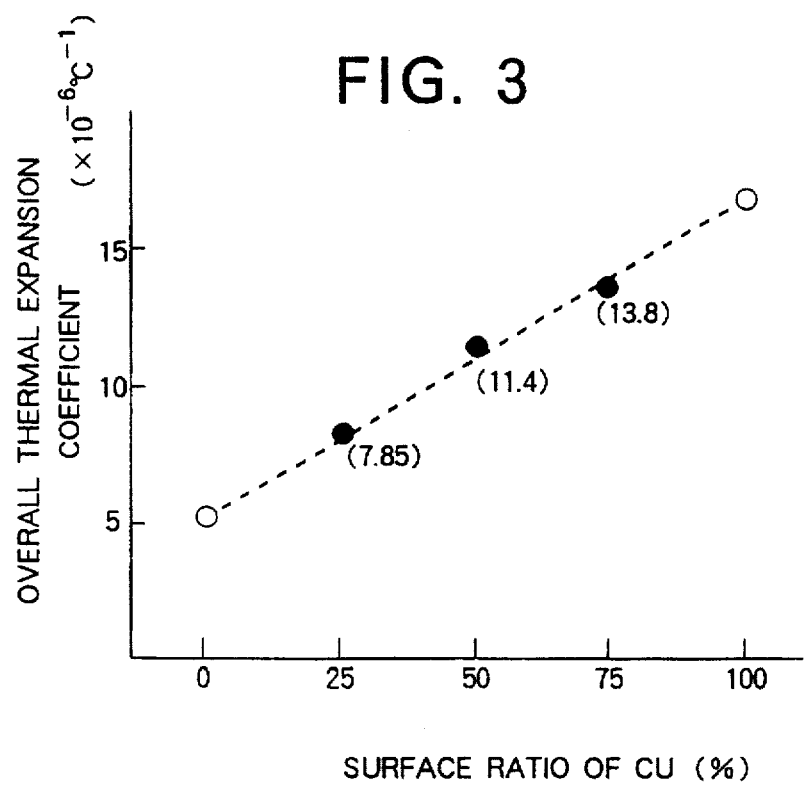
FIG. 3 is a vertical sectional view showing the structure of a multilayer printed circuit board according to a second embodiment of the present invention.

The thermal expansion coefficient of a 28-pin plastic TSOP (II) (400 mil) package, for example, which houses a 16M DRAM chip having dimensions of 7.0 mm in length, 15.0 mm in width and 0.5 mm in thickness is 8 to $10 \times 10^{-6°}$ C.$^{-1}$ at the temperatures ranging between $-40°$ and $125°$ C. By performing a simulation based on the above data of the package and the circuit board, it is found that it is highly possible to obtain a sufficient reliability for the circuit board mounting the 28-pin plastic TSOP package, so long as the thermal expansion coefficient of the circuit board is less than $13 \times 10^{-6°}$ C.$^{-1}$. FIG. 3 shows a relationship between the surface ratio of the exposed copper surface to the overall conductor surface and the thermal expansion coefficient of the resultant circuit board, wherein the solid marks are measured in this test while the open marks are values recited on a catalogue.

From FIG. 3, it will be understood that the surface ratio of the exposed copper surface should be below about 75% in order to obtain a thermal expansion coefficient of less than $13 \times 10^{-6°}$ C.$^{-1}$.

The reliability of the circuit board according to the first embodiment was evaluated, in which an inner interconnection having a thickness of 35 μm is covered with the latticed fernico films each having a thickness of 10 μm. Results of the evaluation showed that the multilayer printed circuit board had a sufficient reliability.

Copper and Kovar should be compared with each other with regard to heat conductivity in addition to the thermal expansion coefficient as described above. Copper has a heat conductivity of 300 to 380 W/mK while Kovar has a heat conductivity of 17 W/mK. In other words, copper has a heat conductivity about 20 times larger than that of Kovar. The heat conductivity of glass fabric epoxy used for an insulating layer of a multilayer printed circuit board is generally about 0.2 to 0.4 W/mK, and the mean heat conductivity of the circuit board greatly depends on the quantity of the copper sheet in the conductor layer.

A larger quantity of Kovar decreases heat radiation from the circuit board. Taking into consideration a tendency toward larger power consumption of LSIs in recent years, it is preferable to minimize the reduction in heat radiation. In this point of view, the use of a smaller amount of Kovar is desirable, and therefore, the surface ratio of the exposed copper to conductor layer should be more than about 25%.

Further, taking into consideration the relationship between copper and Kovar with respect to both the thermal expansion coefficient and heat conductivity, it is preferable to design the total thickness of the Kovar films to the conductor layer being between about ⅓ and ⅔, and more preferably about ⅓ and ½.

Figure 4:
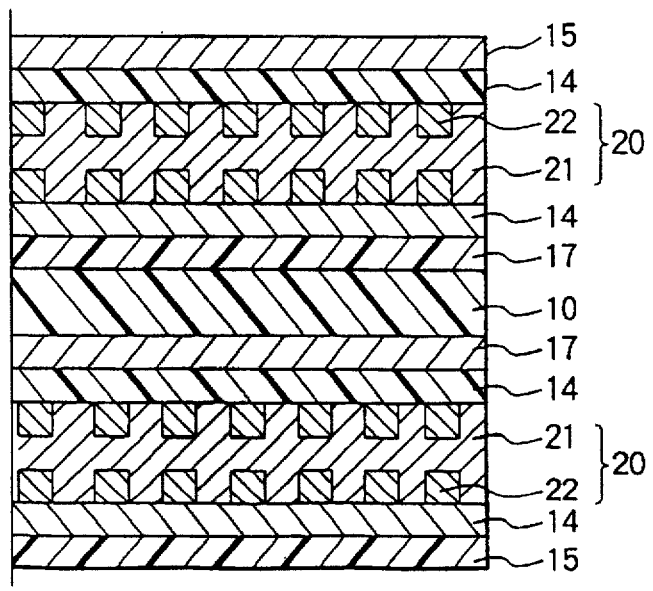
FIG. 4 is a graph of the relationship between the overall thermal expansion coefficient of a circuit board and the area ratio of exposed copper surface to conductive layer surface.

FIG. 4 shows a multilayer printed circuit board according to a second embodiment of the present invention. In this embodiment, the present invention is applied to a multilayer printed circuit board having an example six-layer interconnection structure. The circuit board has a single planar insulating substrate 10 and a signal line layer 17, an inner interconnection layer 20 and an outer interconnection layer 15 which are formed consecutively on each planar surface of the insulating substrate 10, with respective prepregs 14 sandwiched between each two of the layers. The circuit board of the present embodiment has a symmetric structure in which conductor layers 17, 20 and 15 are arranged symmetrically with respect to the central plane of the planar insulating substrate 10.

Each of the inner interconnection layers 20 has a copper sheet 21 and a latticed Invar film 22, which consists substantially of 36 wt. % of nickel and the balance of iron, and which is press-bonded to each surface of the copper sheet 21. The configuration of the inner interconnection layer 20 is similar to the configuration of the inner interconnection layer in the first embodiment.

The symmetric structure of the circuit board prevents the circuit board from warping, which would otherwise occur due to a difference in thermal expansion coefficients between both sides of the insulating substrate 10. Invar used in this second embodiment has a thermal expansion coefficient of $2.0 \times 10^{-6}$ °C.$^{-1}$, which is smaller than that of copper by about one order of magnitude. As in the case of Kovar, the use of Invar results in a reduction of the thermal expansion coefficient of the inner interconnection 20.

The above embodiments are described purposes of example, and the present invention is not limited to such embodiments and it will be obvious for those skilled in the art that various modifications or alterations can be easily made based on the above example embodiments within the scope of the present invention.

What is claimed is:

1. A multilayer printed circuit board comprising:
   a planar substrate having first and second conductor support surfaces;
   at least one conductor layer overlaying one of said first and second conductor support surfaces, said conductor layer including
   a metallic sheet made of a first metal having a first and a second surface and having a first thermal expansion coefficient, and
   a second metallic fill having a first pattern, formed on said first and second surfaces of said metallic sheet, at least a first portion of said metallic sheet being flush with said first pattern to form a planar surface of said conductor layer, said second metallic film being made of a second metal having a second thermal expansion coefficient lower than said first thermal expansion characteristic.

2. A multilayer printed circuit board as defined in claim 1 wherein said first pattern is a lattice exposing said metallic sheet at each interstice of said lattice.

3. A multilayer printed circuit board as defined in claim 2 wherein exposed portions of said metallic sheet is flush with an exposed surface of said lattice.

4. A multilayer printed circuit board as defined in claim 3 wherein said first metal is copper.

5. A multilayer printed circuit board as defined in claim 4 wherein said second metal is fernico.

6. A multilayer printed circuit board as defined in claim 5 wherein a ratio of an area of said exposed portion to a total area of said conductor layer is between 0.25 and 0.75.

7. A multilayer printed circuit board as defined in claim 5 wherein said metallic film has a thickness between ⅓ and ⅔ of a thickness of said conductor layer.

8. A multilayer printed circuit board as defined in claim 5 wherein said metallic film has a thickness between ⅓ and ½ of a thickness of said conductor layer.

9. A multilayer printed circuit board as defined in claim 5 wherein said multilayer printed circuit board has a thermal expansion coefficient of $10 \times 10^{-6}$ °C.$^{-1}$ to $13 \times 10^{-6}$ °C.$^{-1}$ in a direction parallel to one of said first and second conductor support surfaces.

10. A multilayer printed circuit board as defined in claim 1 wherein said at least one conductor layer includes two conductor layers, respectively overlaying said first and second conductor support surfaces.

11. A multilayer printed circuit board as defined in claim 10 wherein said multilayer printed circuit board has a structure of substantial symmetry with respect to a central plane of said substrate.

12. A multilayer printed circuit board as defined in claim 1 wherein said second metal is Invar.

13. A multilayer printed circuit board as defined in claim 1 wherein said second metal has a heat conductivity lower than a heat conductivity of said first metal.

* * * * *